United States Patent [19]

Hull

[11] 4,369,379
[45] Jan. 18, 1983

[54] CMOS FREQUENCY DIVIDER CIRCUIT HAVING INVALID SIGNAL OVERRIDE

[75] Inventor: Charles G. Hull, Rosenberg, Tex.

[73] Assignee: Texas Instruments Incorporated, Dallas, Tex.

[21] Appl. No.: 130,299

[22] Filed: Mar. 14, 1980

[51] Int. Cl.³ .................. H03K 23/22; H03K 19/007; H03K 19/096
[52] U.S. Cl. ............................... 307/225 C; 307/442; 307/481
[58] Field of Search ............... 307/220 C, 225 C, 443, 307/481, 585, 442, 451, 452, 594

[56] References Cited

U.S. PATENT DOCUMENTS

| | | | |
|---|---|---|---|
| 3,829,712 | 8/1974 | Hama | 307/225 C |
| 3,829,713 | 8/1974 | Canning | 307/225 C |
| 3,845,325 | 10/1974 | Daniels et al. | 307/225 C |
| 4,182,961 | 1/1980 | Dingwall | 307/220 C |

OTHER PUBLICATIONS

D. Bingham, "CMOS: Higher Speeds . . . " Electronic Design, vol. 23, Nov. 8, 1978.

Primary Examiner—Larry N. Anagnos
Attorney, Agent, or Firm—Melvin Sharp; Leo Heiting; Robert Marshall

[57] ABSTRACT

An improved CMOS frequency divider circuit is disclosed which has override logic for forcing the circuit to exit from a forbidden state to a valid state.

7 Claims, 3 Drawing Figures

CMOS FREQUENCY DIVIDER CIRCUIT HAVING INVALID SIGNAL OVERRIDE

BACKGROUND OF THE INVENTION

1. Field of the Invention

The present invention relates generally to frequency divider circuits and, more particularly, to an improved CMOS frequency divider circuit.

2. Prior Art Statement

Frequency divider circuits have been well known and widely used in the various semiconductor technologies for many years. However, only relatively recently has the complementary-metal-oxide-semiconductor (CMOS) technology become sufficiently well understood to make large scale integration (LSI) economically feasible. Such advances have made possible frequency divider circuit implementations which would be unavailable in other technologies. In "CMOS: Higher speeds, more drive and analog capability expand its horizon" (Bingham, *Electronic Design* 23, Nov. 8, 1979, Pp. 74–82), a static divide-by-3 requiring 24 transistors is shown in FIG. 2b. Using the inherent capabilities of CMOS, however, a dynamic divide-by-3 circuit requiring only 12 transistors can be fabricated as shown in FIG. 2a (see also FIG. 1 herein). However, the latter circuit may, in some circumstances, assume forbidden states from which exit to a valid state is impossible.

SUMMARY OF THE INVENTION

A frequency divider is provided having first, second and third divider stages. Each divider stage has a storage element which maintains a logical condition established thereon, NOR logic for establishing a logical high condition in the storage element in response to receiving a logical low input signal when a selected one of the other storage means is in the logical low condition, and AND logic for establishing a logical low condition in the storage element in response to receiving a logical high input signal when the selected one of the other storage elements is in the logical high condition. In response to detecting the same logical condition in all but one of the storage elements, an override circuit forces the other one of the storage elements to the opposite logical condition.

One object of the present invention is to provide a frequency divider having means for forcing the exit from forbidden states.

Another object of the present invention is to provide an improved CMOS divide-by-3 circuit.

Other objects and advantages of the present invention will be evident from the following detailed description, when read in conjunction with the accompanying drawings which illustrate the preferred embodiment thereof.

BRIEF DESCRIPTIONS OF THE DRAWINGS

DESCRIPTION OF THE PREFERRED EMBODIMENT

Figure 1:
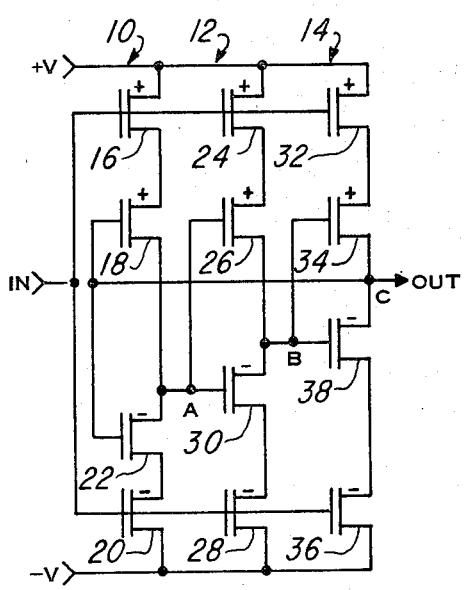
FIG. 1 is a schematic representation of a prior art CMOS divide-by-3 circuit.

Shown in FIG. 1 is a prior art CMOS divide-by-3 having first, second and third divider stages 10, 12 and 14, respectively. In the first divider stage 10, a NOR logic gate comprised of P-channel transistors 16 and 18 establishes a logical high condition on a storage node A in response to a logical low input signal on the gate of the transistor 16 when the logical condition of a storage node C on the gate of the transistor 18 is logically low. An AND logic gate comprised of N-channel transistors 20 and 22 establishes a logical low condition on the storage node A in response to a logical high input signal on the gate of the transistor 20 when the logical condition of the storage node C on the gate of the transistor 22 is logically high.

In the second divider stage 12, a NOR logic gate comprised of P-channel transistors 24 and 26 establishes a logical high condition on a storage node B in response to a logical low input signal on the gate of the transistor 24 when the logical condition of the storage node A on the gate of the transistor 26 is logically low. An AND logic gate comprised of N-channel transistors 28 and 30 establishes a logical low condition on the storage node B in response to a logical high input signal on the gate of the transistor 28 when the logical condition of the storage node A on the gate of the transistor 30 is logically high.

In the third divider stage 14, a NOR logic gate comprised of P-channel transistors 32 and 34 establishes a logical high condition on the storage node C in response to a logical low input signal on the gate of the transistor 32 when the logical condition of the storage node B on the gate of the transistor 34 is logically low. An AND logic gate comprised of N-channel transistors 36 and 38 establishes a logical low condition on the storage node C in response to a logical high input signal on the gate of the transistor 36 when the logical condition of the storage node B on the gate of the transistor 38 is logically low.

Figure 2:
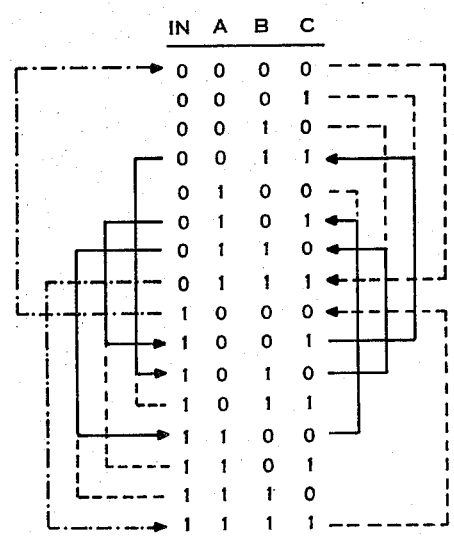
FIG. 2 is a truth table for the prior art frequency divider shown in FIG. 1.
Figure 3:
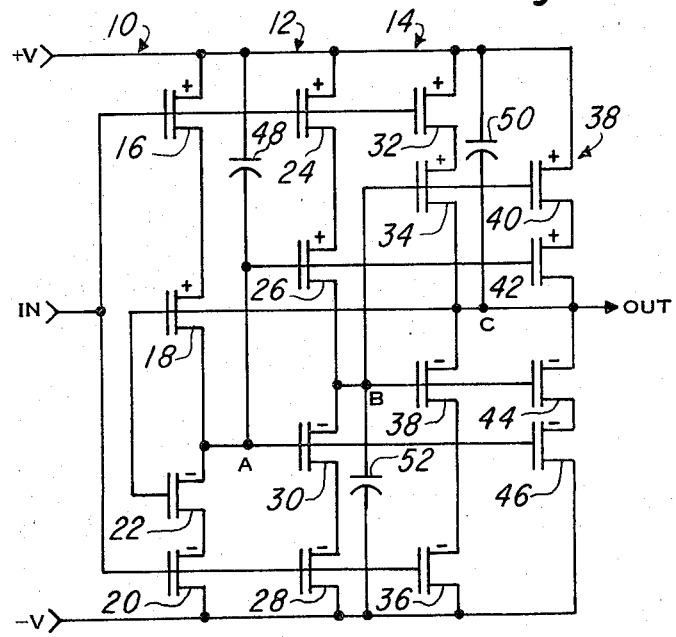
FIG. 3 is a schematic representation of an improved CMOS frequency divider constructed in accordance with the preferred embodiment of the present invention.

Assuming that each of the storage nodes A, B and C has sufficient capacitance to maintain the logical conditions established thereon for at least three transitions of the input signal, the desired progression of logical conditions on the storage nodes A, B and C in response to sequential transitions of the input signal is as illustrated in solid line arrows in FIG. 2. However, in unusual circumstances, such as upon initial application of the operating potentials $+V$ and $-V$, the storage nodes A, B and C may assume "forbidden" states outside the desired progression. In most of such possible states, the divider circuit is unstable and will automatically progress to one of the valid states, as indicated by the dashed lines in FIG. 2. On the other hand, it will be seen that there are two stable, forbidden states ($A=B=C=0$ and $A=B=C=1$) between which the circuit will continually oscillate and never exit, as indicated by the dot-dashed arrows in FIG. 2. In the preferred form of the present invention shown in FIG. 3, an override circuit 38 is provided to detect these forbidden states and to force an exit to the adjacent valid states.

In the override circuit 38, a NOR logic gate comprised of P-channel transistors 40 and 42 establishes a logical high condition of the storage node C when the logical conditions of the storage nodes A and B on the gates of the transistors 42 and 40, respectively, are simultaneously logically low. An AND logic gate comprised of N-channel transistors 44 and 46 establishes a logical low condition on the storage node C when the logical conditions of the storage nodes A and B on the gates of the transistors 46 and 44, respectively, are simultaneously logically high. In other words, the storage node C is forced into a logical condition opposite that of the storage nodes A and B, and the circuit automatically progresses to the adjacent valid state.

In some circumstances, it may be desirable to provide the storage nodes A, B and C with some additional capacitance to assure sufficient dynamic charge storage capacitance and to compensate for the charge sharing which occurs under normal operating conditions. For example, auxiliary capacitors 48 and 50 may be provided between the +V operating potential and the storage nodes A and C, respectively, and an auxiliary capacitor 52 may be provided between the −V operating potential and the storage node B. This configuration often prevents entry into the stable forbidden states since the storage nodes A and C tend to be pulled to the logical high condition and the storage node B to the logical low condition upon application of the operating potentials.

The preferred form of the present invention as described herein is particularly well adapted for use in timing systems wherein an oscillator or the like provides the input signal at a primary frequency and the output signal is utilized to operate system components at a secondary frequency one-third that of the primary frequency. In addition, more than one of the divider circuits may be chained to provide greater frequency reduction when desired. These and other changes may be made in the construction or arrangement of the parts or elements of the preferred embodiment without departing from the spirit and scope of the present invention as defined in the appended claims.

I claim:

1. A frequency divider comprising:
a first divider stage including first storage means for maintaining a logical condition therein, first logic means for establishing a logical high condition in said first storage means in response to a logical low input signal when a third storage means is in the logical low condition and for leaving said logical condition in said first storage means unchanged otherwise, and second logic means for establishing a logical low condition in said first storage means in response to a logical high input signal when said third storage means is in a logical high condition and for leaving said logical state in said first storage means unchanged otherwise;
second divider stage including second storage means for maintaining a logical condition therein, third logic means for establishing a logical high condition in said second storage means in response to a logical low input signal when said first storage means is in the logical low condition and for leaving said logical condition of said second storage means unchanged otherwise, and fourth logic means for establishing a logical low condition in said second storage means in response to a logical high input signal when said first storage means is in the logical high condition and for leaving said logical condition in said second storage means unchanged otherwise;
third divider stage including said third storage means for maintaining a logical condition therein, fifth logic means for establishing a logical high condition in said third storage means in response to a logical low input signal when said second storage means is in the logical low condition and for leaving said logical condition of said third storage means unchanged otherwise, and sixth logic means for establishing a logical low condition in said third storage means in response to a logical high input signal when said second storage means is in the logical high condition and for leaving said logical condition in said third storage means unchanged otherwise; and
override means including means for detecting the logical condition of said first and second storage means and means for establishing the opposite logical condition in said third storage means in response to detecting the same logical condition on both said first and second storage means.

2. A frequency divider as claimed in claim 1, wherein said override means comprises;
seventh logic means for establishing a logical high condition in said third storage means when both said first and second storage means are in the logical low condition and for leaving said logical condition in said third storage means unchanged otherwise; and
eight logic means for establishing a logical low condition in said third storage means when both said first and second storage means are in the logical high condition and for leaving said logical condition in said third storage means unchanged otherwise.

3. A frequency divider as claimed in claim 2, wherein:
said first, third, and fifth logic means each comprise first and second P-channel field effect devices having source drain paths connected in series between a positive operating potential and the corresponding storage means, the gate of said first P-channel field effect device being responsive to the input signal and the gate of said second P-channel field effect device of said first, third, and fifth logic means connected to said third, first and second storage means, respectively; and
said second, fourth, and sixth logic means each comprise first and second N-channel field effect devices having their source drain paths connected in series between a negative operating potential and the corresponding storage means, the gate of said first N-channel field effect device responsive to said input signal and the gate of said second N-channel field effect device of said second, fourth, and sixth logic means connected to said third, first, and second storage means, respectively.

4. A frequency divider as claimed in claim 3, wherein said first, second, and third storage means each comprises the gate capacitance of said corresponding second P-channel field effect device and said corresponding second N-channel field effect device.

5. A frequency divider as claimed in claim 4, wherein said first, second, and third storage means each further includes an auxiliary capacitor connected between a selected one of said operating potentials and said gates of said corresponding second P-channel field effect device and said corresponding second N-channel field effect device.

6. A frequency divider as claimed in claim 2, wherein:
said seventh logic means comprises first and second P-channel field effect devices having source drain paths connected in series between a positive operating potential and said third storage means, the gate of said first P-channel field effect device connected to said first storage means and the gate of said second P-channel field effect device connected to said second storage means; and said eighth logic means comprises first and second N-channel field effect devices having source drain paths connected in series between a negative operating potential and said third storage means, the gate of said first N-channel field effect device connected to said first storage means and the gate of said second N-channel field effect device connected to said second storage means.

7. In a timing system having means for providing an input signal at a primary frequency, a frequency divider circuit for providing an output signal at a secondary frequency one-third that of the primary frequency, the divider circuit comprising:

a first divider stage including first storage means for maintaining a logical condition therein, first logic means for establishing a logical high condition in said first storage means in response to a logical low input signal when a third storage means is in the logical low condition and for leaving said logical condition in said first storage means unchanged otherwise, and second logic means for establishing a logical low condition in said first storage means in response to a logical high input signal when said third storage means is in a logical high condition and for leaving said logical state in said first storage means unchanged otherwise;

second divider stage including second storage means for maintaining a logical condition therein, third logic means for establishing a logical high condition in said second storage means in response to a logical low input signal when said first storage means is in the logical low condition and for leaving said logical condition of said second storage means unchanged otherwise, and fourth logic means for establishing a logical low condition in said second storage means in response to a logical high input signal when said first storage means is in the logical high condition and for leaving said logical condition in said second storage means unchanged otherwise;

third divider stage including said third storage means for maintaining a logical condition therein, fifth logic means for establishing a logical high condition in said third storage means in response to a logical low input signal when said second storage means is in the logical low condition and for leaving said logical condition of said third storage means unchanged otherwise, and sixth logic means for establishing a logical low condition in said third storage means in response to a logical high input signal when said second storage means is in the logical high condition and for leaving said logical condition in said third storage means unchanged otherwise; and override means including means for detecting the logical condition of said first and second storage means and means for establishing the opposite logical condition in said third storage means in response to detecting the same logical condition on both said first and second storage means.

* * * * *